(12) United States Patent
Shin et al.

(10) Patent No.: US 8,098,012 B2
(45) Date of Patent: Jan. 17, 2012

(54) PHOTO-SENSITIVE COMPOSITION, PHOTO-SENSITIVE PASTE COMPOSITION FOR BARRIER RIBS COMPRISING THE SAME, AND METHOD FOR PREPARING BARRIER RIBS FOR PLASMA DISPLAY PANEL

(75) Inventors: Hyea-Weon Shin, Suwon-si (KR); Yon-Goo Park, Suwon-si (KR); Bong-Gi Kim, Hwaseong (KR); Chan-Seok Park, Yongin-si (KR); Sung-Mun Ryu, Hwaseong (KR)

(73) Assignee: Samsung SDI Co., Ltd., Gongse-dong, Giheung-gu, Yongin-si, Gyeonggi-do (KR)

( * ) Notice: Subject to any disclaimer, the term of this patent is extended or adjusted under 35 U.S.C. 154(b) by 0 days.

(21) Appl. No.: 12/461,918

(22) Filed: Aug. 27, 2009

(65) Prior Publication Data
US 2009/0317604 A1 Dec. 24, 2009

Related U.S. Application Data

(63) Continuation of application No. 11/287,432, filed on Nov. 28, 2005, now Pat. No. 7,588,877.

(30) Foreign Application Priority Data

Nov. 30, 2004 (KR) .................. 10-2004-0099482

(51) Int. Cl.
*H01J 17/49* (2006.01)
*G03F 7/00* (2006.01)
*G03F 7/004* (2006.01)

(52) U.S. Cl. ............... 313/582; 430/270.1; 430/281.1; 430/320

(58) Field of Classification Search ............ 430/270.1, 430/281.1, 905, 311, 320, 331, 913, 927, 430/950
See application file for complete search history.

(56) References Cited

U.S. PATENT DOCUMENTS

| 4,613,560 | A | * | 9/1986 | Dueber et al. ............ 430/286.1 |
| 5,541,618 | A | | 7/1996 | Shinoda |
| 5,661,500 | A | | 8/1997 | Shinoda et al. |
| 5,663,741 | A | | 9/1997 | Kanazawa |

(Continued)

FOREIGN PATENT DOCUMENTS

CN 1509489 6/2004

(Continued)

OTHER PUBLICATIONS

"*Final Draft International Standard*", project No. 47C/61988-1/Ed. 1; Plasma Display Panels—Part 1: Terminology and letter symbols, published by International Electronical Commission, IEC. in 2003, and Appendix A—Description of Technology, Annex B—Relationship Between Voltage Terms and Discharge Characteristics; Annex C—Gaps and Annex D—Manufacturing.

(Continued)

*Primary Examiner* — Amanda C. Walke
(74) *Attorney, Agent, or Firm* — Robert E. Bushnell, Esq.

(57) ABSTRACT

A photosensitive composition, which has a cross-linking monomer having at least two ethylenic double bonds, a photopolymerization initiator, and an organic solvent, and a method of preparing a barrier rib for a plasma display panel, wherein the photosensitive composition is used. The photosensitive composition provides improved adherence to an inorganic material and an organic material.

10 Claims, 1 Drawing Sheet

U.S. PATENT DOCUMENTS

| | | | |
|---|---|---|---|
| 5,674,553 A | 10/1997 | Shinoda | |
| 5,724,054 A | 3/1998 | Shinoda et al. | |
| 5,786,794 A | 7/1998 | Kishi et al. | |
| 5,952,782 A | 9/1999 | Nanto et al. | |
| 5,972,564 A | 10/1999 | Kawana et al. | |
| 6,043,604 A | 3/2000 | Horiuchi et al. | |
| 6,297,310 B1 | 10/2001 | Jang et al. | |
| RE37,444 E | 11/2001 | Kanazawa | |
| 6,371,822 B1 | 4/2002 | Oh | |
| 6,407,509 B1 | 6/2002 | Ikeda et al. | |
| 6,630,916 B1 | 10/2003 | Shinoda | |
| 6,635,992 B1 * | 10/2003 | Iguchi et al. | 313/582 |
| 6,707,436 B2 | 3/2004 | Setoguchi et al. | |
| 6,812,641 B2 | 11/2004 | Fujitani et al. | |
| 6,870,315 B2 * | 3/2005 | Iguchi et al. | 313/582 |
| 6,897,564 B2 | 5/2005 | Kim et al. | |
| 6,967,442 B2 | 11/2005 | Kimura et al. | |
| 6,998,781 B2 | 2/2006 | Kimura et al. | |
| 7,002,297 B2 | 2/2006 | Aoki et al. | |
| 7,004,812 B2 * | 2/2006 | Uegaki et al. | 445/51 |
| 7,057,342 B2 | 6/2006 | Aoki et al. | |
| 7,083,491 B2 | 8/2006 | Tsuji et al. | |
| 7,102,287 B2 | 9/2006 | Nishitani et al. | |
| 2002/0008470 A1 * | 1/2002 | Uegaki et al. | 313/567 |
| 2008/0220368 A1 * | 9/2008 | Lee | 430/281.1 |
| 2008/0226320 A1 * | 9/2008 | Sakata et al. | 399/55 |
| 2008/0238318 A1 * | 10/2008 | Lee et al. | 313/582 |

FOREIGN PATENT DOCUMENTS

| | | |
|---|---|---|
| CN | 1438667 | 8/2008 |
| JP | 02-148645 | 6/1990 |
| JP | 2845183 | 10/1998 |
| JP | 2917279 | 4/1999 |
| JP | 01-043804 | 2/2001 |
| JP | 01-325888 | 11/2001 |
| KR | 10-1998-0080296 | 11/1998 |
| KR | 10-2000-0015470 | 3/2000 |
| KR | 10-2001-0018259 | 3/2001 |
| KR | 10-2002-0011560 | 2/2002 |
| KR | 10-2002-0084811 | 11/2002 |
| KR | 10-2004-0012298 | 2/2004 |

OTHER PUBLICATIONS

Office Action from Chinese Patent Office issued in Applicant's corresponding Chinese Patent Application No. 200510125865.1 dated Jun. 19, 2009 with Request for Entry of the Accompanying Office Action.

* cited by examiner

PHOTO-SENSITIVE COMPOSITION, PHOTO-SENSITIVE PASTE COMPOSITION FOR BARRIER RIBS COMPRISING THE SAME, AND METHOD FOR PREPARING BARRIER RIBS FOR PLASMA DISPLAY PANEL

CLAIM OF PRIORITY

This application makes reference to, incorporates the same herein, and claims all benefits accruing under 35 U.S.C. §119 from an application for PHOTO-SENSITIVE COMPOSITION, PHOTO-SENSITIVE PASTE COMPOSITION FOR BARRIER RIBS COMPRISING THE SAME, AND METHOD FOR PREPARING BARRIER RIBS FOR PLASMA DISPLAY PANEL earlier filed in the Korean Intellectual Property Office on 30 Nov. 2004 and there duly assigned Serial No. 10-2004-0099482. Furthermore, this application is a Continuation of Applicants' Ser. No. 11/287,432 filed in the U.S. Patent & Trademark Office on 28 Nov. 2005 and now issued as U.S. Pat. No. 7,588,877 on 15 Sep. 2009, and assigned to the assignee of the present invention.

FIELD OF THE INVENTION

The present invention relates to a photosensitive composition, a composition for forming a barrier rib comprising the same, and a method of preparing a plasma display panel using the same. More particularly, the present invention relates to a photosensitive composition which has improved adherence to an organic material and an inorganic material and is capable of forming a finely-patterned barrier rib, a composition for forming a barrier rib comprising the same, and a method of preparing a plasma display panel using the same.

BACKGROUND OF THE INVENTION

A plasma display panel (PDP) is a flat display device using a plasma phenomenon, which is also called a gas-discharge phenomenon since a discharge is generated in the panel when a potential greater than a certain level is applied to two electrodes separated from each other under a gas atmosphere in a non-vacuum state. Such a gas-discharge phenomenon is applied to display an image in the plasma display panel. At present, a generally used plasma display panel is a reflective alternating current driven plasma display panel. On a rear substrate, phosphor layers are formed in discharge cells compartmentalized by a barrier rib. The above plasma display panel forms its outer shape by positioning a rear substrate and a front substrate (for convenience, referred to as a first substrate and a second substrate, respectively) spaced with a predetermined distance therebetween and substantially parallel with each other like other flat panel display devices such as vacuum fluorescence display (VFD) or a field emission display (FED). The substrates are joined using a binder along their circumferences to form a discharge cell in a vacuum state.

Recent developments in the display industry are spurring work for manufacture of display panels with high resolution. The development of a photo-sensitive composition capable of forming a finely-patterned barrier rib is also gaining the same momentum as a part of the work. A barrier rib for a plasma display panel is generally formed by etching an inorganic material layer, which has already been covered with a protection layer with a predetermined pattern. However, conventional inorganic materials have revealed some limits in forming finely patterned ribs. They do not have good adherence to a protection layer and even cause the protection layer to tear away during the etching, resulting in uneven etching at junctions of the inorganic materials and the protection layer.

SUMMARY OF THE INVENTION

An embodiment of the present invention provides a photosensitive composition having improved adherence to an inorganic material and an organic material.

Another embodiment of the present invention provides a composition for forming a barrier rib, including the photosensitive composition.

Yet another embodiment of the present invention provides a method of preparing a barrier rib of a plasma display panel using the photosensitive composition.

An embodiment of the present invention provides a photosensitive composition which includes a cross-linking monomer having at least two ethylenic double bonds, a photopolymerization initiator, and an organic solvent.

Another embodiment of the present invention provides a composition for forming a barrier rib which includes the above photosensitive composition and a mother-glass powder.

Another embodiment of the present invention provides a method of preparing a plasma display panel, which includes the following processes: a photosensitive barrier rib layer is formed on a substrate where an address electrode and a dielectric layer are formed using a composition including the photosensitive composition and a mother-glass powder. An etching-protection layer including a photosensitive organic material is coated on the photosensitive barrier rib layer and is then patterned through exposure and development. The barrier rib on which the etching-protection layer does not remain is etched to form a barrier rib of a predetermined pattern. The etching-protection layer which remains on the barrier rib is removed, and the barrier rib is fired.

BRIEF DESCRIPTION OF THE DRAWING

A more complete appreciation of the present invention, and many of the above and other features and advantages of the present invention, will be readily apparent as the same becomes better understood by reference to the following detailed description when considered in conjunction with the accompanying drawing in which like reference symbols indicate the same or similar components, wherein.

DETAILED DESCRIPTION OF THE INVENTION

Figure 1:
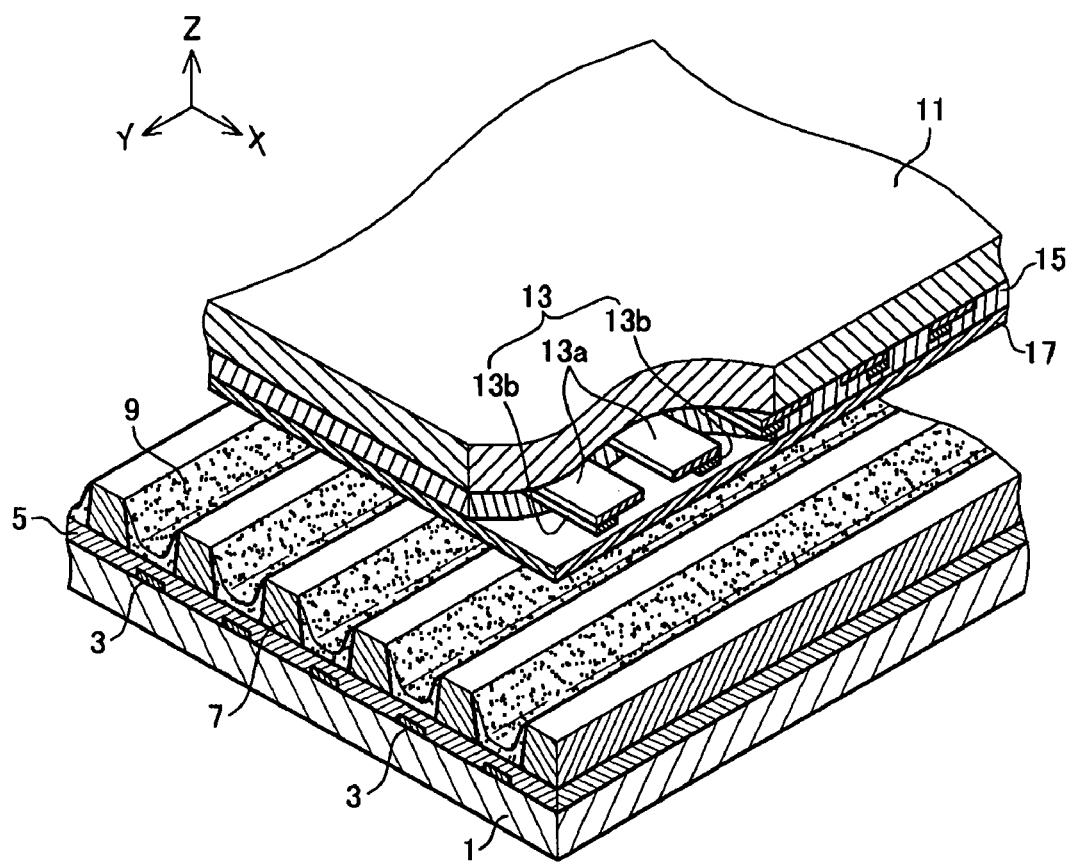
FIG. 1 is a partial exploded perspective view showing the structure of a plasma display panel.

An embodiment of the present invention will hereinafter be described in detail with reference to the accompanying drawings. In general, a barrier rib for a plasma display panel is formed by etching an inorganic barrier rib layer after covering the inorganic barrier rib layer with an organic etching-protection layer and forming a predetermined pattern. However, etching is not evenly performed because a conventional barrier rib layer does not have good adherence to an etching-protection layer, and it even causes the protection layer to tear apart during the etching, causing failure to accomplish high-definition rib patterns. In order to solve this problem, an agent for improving adherence such as a silane coupling additive has been added to an etching-protection layer, but this has only resulted in impeding the storage stability of a composition which comprises the protection layer, because the agent itself was not stable.

A photosensitive composition of an embodiment of the present invention can be mixed with a mother-glass powder for a barrier rib, which is an inorganic material. The photosensitive composition includes a cross-linking monomer with more than two ethylenic double bonds, a photopolymerization initiator, and an organic solvent.

This photosensitive composition has an effect of improving adherence between an inorganic material of a barrier rib layer and an etching-protection layer, which is an organic material, by being cured by light radiation.

The photopolymerization initiator, which is included in the photosensitive composition, initiates polymerization of cross-linking monomers by light. It is preferably included in an amount of 10 to 50 parts by weight and more preferably 25 to 40 parts by weight, based on 100 parts by weight of the cross-linking monomer.

When the amount of the photopolymerization initiator is under 10 parts by weight based on 100 parts by weight of the cross-linking monomer, the polymerization initiation rate is too slow to secure sufficient adherence. On the contrary, when the amount of the photopolymerization initiator is over 50 parts by weight, the photosensitive composition has lower stability.

The photopolymerization initiator may preferably be at least one selected from the group consisting of triazine-based, benzoin-based, acetophenone-based, amido ketone-based, imidazole-based, and xanthone-based compounds. According to the preferred embodiment, it may be at least one selected from the group consisting of 2,4-bistrichloromethyl-6-p-methoxystyryl-s-triazine, 2-p-methoxystyryl-4,6-bis-trichloromethyl-s-triazine, 2,4-trichloromethyl-6-triazine, 2,4-trichloromethyl-4-methylnaphthyl-6-triazine, benzophenone, p-(diethylamino)benzophenone, 2,2-dichloro-4-phenoxyacetophenone, 2,2'-diethoxyacetophenone, 2,2'-dibutoxyacetophenone, 2-hydroxy-2-methylpropinophenone, p-t-butyltrichloroacetophenone, 2-methylthioxanthone, 2-isobutylthioxanthone, 2-dodecylthioxanthone, 2,4-dimethylthioxanthone, 2,4-diethylthioxanthone, 2-benzyl-2-(dimethyl amino)-1-[-4-(4-morpholinyl)phenyl]-1-butanone, 2-methyl-1-[4-(methylthio)phenyl]-2-(4-morpholinyl)-1-propanone, and 2,2'-bis-2-chlorophenyl-4,5,4', 5'-tetraphenyl-2'-1,2'-biimidazole. The photopolymerization initiator of the present invention which is included in the photosensitive composition is not limited thereto.

The cross-linking monomer is preferably at least one selected from the group consisting of acrylate-based compounds and methacrylate-based compounds. According to the preferred embodiment, it may be at least one selected from the group consisting of 1,4-butanedioldiacrylate, 1,3-butyleneglycoldiacrylate, ethyleneglycoldiacrylate, pentaerythrytoltetraacrylate, triethyleneglycoldiacrylate, polyethyleneglycoldiacrylate, dipentaerythrytoldiacrylate, sorbitoltriacrylate, a bisphenol A diacrylate derivative, trimethylpropanetriacrylate, ethyleneoxide addition trimethylpropanetriacrylate, dipentaerythrytolpolyacrylate, 1,4-butanedioldimethacrylate, 1,3-butyleneglycoldimethacrylate, ethyleneglycoldimethacrylate, pentaerythrytoltetramethacrylate, triethyleneglycoldimethacrylate, polyethyleneglycoldimethacrylate, dipentaerythrytoldimethacrylate, sorbitoltrimethacrylate, a bisphenol A dimethacrylate derivative, trimethylpropanetrimethacrylate, and dipentaerythrytolpolymethacrylate. The cross-linking monomer of the present invention which is included in the photosensitive composition is not limited thereto.

The organic solvent included in the photosensitive composition may be any one if it is capable of dispersing the photopolymerization initiator and the cross-linking monomer.

Exemplary organic solvents includes ethyleneglycolmonomethyletheracetate, propyleneglycolmonomethylether, propyleneglycolmethyletheracetate, propyleneglycolmonoethyletheracetate, diethyleneglycoldimethylether, diethyleneglycolmethylethylether, cyclohexanone, 3-methoxyethyl propionate, 3-ethoxymethyl propionate, 3-ethoxyethyl propionate, methyl ethyl ketone, isopropyl alcohol, ethanol, methanol, butyl cellosolve (BC), butyl carbitol acetate (BCA), terpineol (TP), and texanol. The amount of the organic solvent may be suitably controlled according to necessity thereof.

The above photosensitive composition has an effect of improving the adherence between an inorganic barrier rib layer and an organic etching-protection layer, and can be added to a barrier rib paste as an additive for a forming a barrier rib in the preparation of a barrier rib for a plasma display panel.

A composition for forming a barrier rib of an embodiment of the present invention includes the above photosensitive composition and a mother-glass powder for a barrier rib.

Here, the photosensitive composition is preferably included in an amount of 5 to 15 parts by weight, and more preferably 7 to 10 parts by weight, based on 100 parts by weight of mother-glass powder for a barrier rib.

When the amount of the photosensitive composition is under 5 parts by weight, it may have low adherence to an etching-protection layer. On the contrary, over 15 parts by weight of the photosensitive composition can deteriorate the property of a barrier rib or the peeling of an etching-protection layer.

Here, the mother-glass powder has no particular limits if it is commonly used for preparing a plasma display panel.

In addition, the composition for forming a barrier rib can further include a binder and an organic solvent. Here, the solid content is preferably included to the composition for forming a barrier rib in the range of 65 to 85 wt %. When this concentration of the solid powder is under 65 wt %, it is hard to obtain a finely-structured layer. On the contrary, a concentration of over 85 wt % makes it difficult to produce stable dispersion characteristics.

The binder can also be added to the composition for a barrier rib, if it is commonly used to prepare a barrier rib for a plasma display panel, but it preferably includes more than one polymer resin selected from an acryl-based resin, an epoxy-based resin, and an ethylcellulose-based resin.

A composition for forming a barrier rib of the present invention is suitable for a method of preparing a plasma display panel by using an etching-protection layer including photosensitive organic material.

A method of preparing a plasma display panel of the present invention includes the following processes. A photosensitive barrier rib layer is formed on a substrate, whereon an address electrode and a dielectric layer are formed by using the composition for forming a barrier rib. An etching-protection layer including photosensitive organic material is coated on the photosensitive barrier rib layer and then it is patterned through exposure and development. The barrier rib layer not covered with the etching-protection layer is etched to form a barrier rib with a predetermined pattern. The etching-protection layer which still remains on the barrier rib is removed, and the barrier rib is fired.

The photosensitive barrier rib layer can be prepared alone. Here, the barrier rib is advantageously in the range of 100 to 160 μm thick.

In addition, the above photosensitive barrier rib layer can be formed on a non-photosensitive barrier rib layer, after first forming the non-photosensitive barrier rib layer on a substrate on which an address electrode and a dielectric layer are formed. Here, the non-photosensitive barrier rib layer is advantageously in the range of 90 to 140 μm thick, while the photosensitive barrier rib layer is advantageously in the range of 10 to 30 μm thick. When the photosensitive barrier rib layer is under 10 μm thick, it is hard to secure sufficient adherence to an organic etching-protection layer. On the contrary, when it is over 30 μm thick, its increased etching-resistance can deteriorate work-yield and even break down a barrier rib. On the other hand, the total thickness of the non-photosensitive barrier rib layer and the photosensitive barrier rib layer is preferably in the range of 100 to 160 μm.

The non-photosensitive barrier rib layer is formed through coating a composition including a mother-glass powder, a binder, and a solvent. The mother-glass powder and the binder can include the same components as above-described. Exemplary examples of the solvent include at least one selected from the group consisting of ethyleneglycolmonomethyletheracetate, propyleneglycolmonomethylether, propyleneglycolmethyletheracetate, propyleneglycolmonoethyletheracetate, diethyleneglycoldimethylether, diethyleneglycolmethylethylether, cyclohexanone, 3-methoxyethyl propionate, 3-ethoxymethyl propionate, 3-ethoxyethyl propionate, methyl ethyl ketone, isopropyl alcohol, ethanol, methanol, butyl cellosolve (BC)), butyl carbitol acetate (BCA), terpineol (TP), and texanol.

After the above photosensitive barrier rib layer is formed on the non-photosensitive barrier rib layer, an etching-protection layer is formed on the photosensitive barrier rib layer.

The etching-protection layer preferably includes a photosensitive organic material and is also advantageous to be formed by using a dry film or liquid photoresist, which is commonly used for preparing a barrier rib for a plasma display panel.

The photosensitive etching-protection layer has a characteristic of being cured by light. Accordingly, it remains in a predetermined pattern on the photosensitive barrier rib layer through patterning procedures such as exposure and development. Here, the photosensitive composition in the photosensitive barrier rib layer is also cured where it receives light.

Next, the aforementioned patterned barrier rib layer is etched. The above etching can include a dry sandblast method and a wet chemical etching method, but the sandblast etching is preferred in the present invention.

During the etching of the patterned barrier rib layer, the barrier rib layer regions not covered with the etching-protection layer are removed and the other regions covered with the etching-protection layer remain, forming a barrier rib with the predetermined pattern of the etching-protection layer.

Then, the barrier rib is prepared by removing the etching-protection layer remaining on the barrier rib and firing the barrier rib. The removing of the etching-protection layer and firing the barrier rib are commonly known and will not be explained in detail.

The above method of preparing a barrier rib is suitable for forming a barrier rib with various line-widths. This method is particularly suitable for forming a barrier rib with fine line-widths and preferably for forming a 30 to 50 μm-line-width barrier rib for a plasma display panel. A plasma display panel according to the present invention includes: a) a first substrate and a second substrate opposed to each other; b) a plurality of address electrodes and a dielectric layer formed on the first substrate, and a plurality of display electrodes, a dielectric layer, and a protection layer formed on the second substrate; c) barrier ribs formed on the first substrate to partition a plurality of discharge cells in a space between the first substrate and the second substrate; and d) a red, a green, and a blue phosphor layer formed inside the discharge cell partitioned by the barrier ribs.

FIG. 1 is a partial perspective view showing an embodiment of the plasma display panel according to the present invention, but the present invention is not limited to the structure shown in FIG. 1.

As shown in FIG. 1, on the first substrate 1 of the present inventive plasma display panel, address electrodes 3 are formed along a certain direction (direction Y in the FIGURE), and a dielectric layer 5 is formed on the front surface of the first substrate 1 and over the address electrodes 3. Barrier ribs 7 are formed on the dielectric layer 5 and may be formed in an open or closed shape. Red (R), green (G), and blue (B) phosphor layers 9 are positioned on a discharge cell between the barrier ribs 7.

On one surface of a second substrate 11 facing to the first substrate 1, display electrodes 13 are formed in a direction perpendicular (direction X in the FIGURE) to that of the address electrodes, wherein a display electrode 13 is composed of a pair of transparent electrodes 13a and a pair of bus electrodes 13b. A transparent dielectric layer 15 and a protection layer 17 are formed on the whole second substrate 11, and cover the display electrodes 13. Thereby, a discharge cell is formed on the cross section of the address electrode 3 and the display electrode 13 and is filled with discharge gases.

When the address voltage (Va) is applied between the address electrode 3 and a certain display electrode 13, the address discharge is generated. Further, when the sustain voltage (Vs) is applied between a pair of display electrodes 13, a vacuum ultraviolet ray generated upon the sustain discharge excites a corresponding phosphor layer 9 to emit visible light though the transparent front surface of the substrate 11.

The following examples illustrate the present invention in further detail. However, it is understood that the present invention is not limited by these examples.

EXAMPLES

Example 1

70 parts by weight of a mother-glass powder (ceramic powder: DGC-562S produced by DAEJOO ELECTRON COMPANY), 1 part by weight of ethylcellulose (EC), and 22 parts by weight of texanol were mixed to disperse the mother-glass sufficiently, and then 5 parts by weight of ethyleneoxide addition-type trimethylpropanetriacrylate (TMP(EO)$_3$TA), 1 part by weight of 2-benzyl-2-(dimethylamino)-1-[-4-(4-morpholinyl)phenyl]-1-butanone (Irgacure369, produced by Ciba Specialty Chemicals) for a photopolymerization initiator, and 1 part by weight of butylcarbitolacetate (BCA) were mixed to prepare a photosensitive paste composition for forming a barrier rib.

Example 2

70 parts by weight of a mother-glass powder (ceramic powder: DGC-562S produced by DAEJOO ELECTRON COMPANY), 1 part by weight of ethylcellulose (EC), and 21 parts by weight of texanol were mixed to sufficiently disperse the mother-glass, and then, 5 parts by weight of trimethylpropanetriacrylate (TMP(EO)$_3$TA), 2 parts by weight of 2-benzyl-2-(dimethyl amino)-1-[-4-(4-morpholinyl)phenyl]-1-butanone (Irgacure369, produced by Ciba Specialty Chemicals) for a photopolymerization initiator, and 1 part by weight of butylcarbitolacetate (BCA) were mixed to prepare a photosensitive paste composition for forming a barrier rib.

Example 3

70 parts by weight of mother-glass powder (ceramic powder: DGC-562S DAEJOO ELECTRON COMPANY), 1 part by weight of ethylcellulose (EC), and 19 parts by weight of texanol were mixed to sufficiently disperse the mother-glass, and then 7 parts by weight of trimethylpropanetriacrylate (TMP(EO)$_3$TA), 2 parts by weight of 2-benzyl-2-(dimethyl amino)-1-[-4-(4-morpholinyl)phenyl]-1-butanone (Irgacure369, produced Ciba Specialty Chemicals) for a photopolymerization initiator, and 1 part by weight of butylcarbitolacetate (BCA) were mixed to prepare a photosensitive paste composition for forming a barrier rib.

Comparative Example 1

70 parts by weight of mother-glass powder (ceramic powder: DGC-562S DGC-562S DAEJOO ELECTRON COMPANY)), 2 parts by weight of ethylcellulose (EC), and 28 parts by weight of texanol were mixed to prepare a photosensitive paste composition for forming a barrier rib.

Table 1 shows the components of a composition for forming a barrier rib prepared according to Examples 1 to 3 and Comparative Example 1.

TABLE 1

| | Example 1 | Example 2 | Example 3 | Comparative Example 1 |
|---|---|---|---|---|
| mother-glass powder | 70 wt % | 70 wt % | 70 wt % | 70 wt % |
| EC | 1 wt % | 1 wt % | 1 wt % | 2 wt % |
| Texanol | 22 wt % | 21 wt % | 19 wt % | 28 wt % |
| TMP(EO)$_3$TA | 5 wt % | 5 wt % | 7 wt % | — |
| photopolymerization initiator (Irgacure369) | 1 wt % | 2 wt % | 2 wt % | — |
| BCA | 1 wt % | 1 wt % | 1 wt % | — |

Experimental Example 1

(Estimation of the Adherence Between a Barrier Rib Layer and an Etching Protection-Layer)

A barrier rib layer was formed by applying a composition for forming a barrier rib prepared according to Examples 1 to 3 and Comparative Example 1 up to 140 μm thick on a glass substrate. An etching-protection layer was formed by applying a 40 μm-thick dry film resist (DF-40R, produced by DONGJIN SEMICHEM) on the barrier rib layer, pressing it with a hot roll, and fully exposing it to 300 mJ/m$^2$ light.

The adherence between the barrier rib layer and the etching-protection layer in each Example were compared and estimated using peeling experiment. After cutting the etching-protection layer into 1.5 cm-wide ribbons, a band-shaped etching-protection layer was peeled off using a measuring instrument of peeling load (1616F, Aikoh Engineering). Table 2 shows the experimental results. The below adherence data in Table 2 were relatively valued in relation to an adherence value of 100 for the barrier rib prepared according to Comparative Example 1.

TABLE 2

| | Example 1 | Example 2 | Example 3 | Comparative Example 1 |
|---|---|---|---|---|
| Adherence (g$_f$) | 187.5 | 212.5 | 225 | 100 |

As shown in Table 2, the photosensitive paste compositions for forming the barrier ribs prepared according to Examples 1 to 3 show excellent adherence to a photosensitive etching-protection layer comprising an organic material.

Experimental Example 2

(Estimation of Etching-Resistance of an Etching-Protection Layer)

Barrier rib layers were formed by applying compositions for forming a barrier rib prepared according to Examples 1 to 3 and Comparative Example 1 up to 140 μm thick on a glass substrate. A patterned etching-protection layer was formed by applying a 40 μm-thick dry film resist (DF-40, produced by DONGJIN SEMICHEM) on each barrier rib layer, pressing it with a hot roll at 105° C., and exposing it in a stripe pattern to 300 mJ/m$^2$ of light and developing it.

Then, the above barrier rib was etched to have a stripe using a sandblast method, and its etching time (indicating etching rate) and minimum line-width of the upper part of the barrier rib were measured. Here, the minimum line-width indicates the width of the upper barrier rib formed after etching, and etching-time indicates time taken to fully form a barrier rib for a plasma display panel. Table 3 shows the measurement results.

TABLE 3

| | Example 1 | Example 2 | Example 3 | Comparative Example 1 |
|---|---|---|---|---|
| minimum line-width (μm) | 30 | 30 | 30 | 80 |
| etching time (sec.) | 42 | 42 | 45 | 40 |

As shown in Table 3, barrier ribs for a plasma display panel prepared according to Examples 1 to 3 have smaller minimum line-widths than that of Comparative Example 1, but take a similar etching time to that of Comparative Example 1.

Experimental Example 3

(Estimation of a Peeling Characteristic of an Etching-Protection Layer)

A barrier rib prepared according to Experimental Example 2 was dipped into a 40° C. aqueous solution with 5.0 wt % monoethanol amine, and the time taken to peel an etching-protection layer and the size of the etching-protection layer remaining on a barrier rib were measured. Table 4 shows the measurement results.

Peeling in Table 4 was estimated based on the following criteria.

A: no photosensitive resin composition remaining on the surface of an inorganic material.

B: under 1.0 μm-sized photosensitive resin composition remaining on the surface of an inorganic material.

C: over 1.0 μm-sized photosensitive resin composition remaining on the surface of an inorganic material.

TABLE 4

|  | Example 1 | Example 2 | Example 3 | Comparative Example 1 |
|---|---|---|---|---|
| Peeling time (sec.) | 30 | 30 | 30 | 30 |
| Peeling properties | A | A | A | A |

As shown in Table 4, the compositions for forming a barrier rib prepared according to Examples 1 to 3 of the present invention proved to have an excellent peeling characteristic of the etching-protection layers after etching as the composition in the Comparative Example 1.

Experimental Example 4

(Estimation of Dispersive Stability of a Composition for Forming a Barrier Rib)

The dispersion stability of photosensitive paste compositions for forming a barrier rib prepared according to Examples 1 to 3 was estimated after storing them for one month at room temperature (25° C.±2.0° C.), and the measurement results are shown in Table 5.

The disperse stability was estimated based on the following criteria in Table 5.

D: the same as the initial dispersion.
E: a mother-glass powder sediments.
F: a composition for forming a barrier rib becomes gel.

TABLE 5

|  | Example 1 | Example 2 | Example 3 | Comparative Example 1 |
|---|---|---|---|---|
| Stability | D | D | D | D |

As shown in Table 5, the compositions for forming a barrier prepared according to Examples 1 to 3 have excellent storage stability as the composition in the Comparative Example 1.

Since a photosensitive composition of the present invention has an effect on improving adherence between an inorganic barrier rib and a photosensitive organic etching-protection layer by being cured with light, it is suitable for forming a fine barrier rib pattern. After etching, it has an excellent peeling characteristic and dispersion stability of an inorganic material.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A barrier rib formed from a composition comprising:
   a photosensitive composition comprising:
      a cross-linking monomer having at least two ethylenic double bonds;
      a photopolymerization initiator; and
      an organic solvent; and
   a mother-glass powder,
   wherein the photopolymerization initiator is included in an amount of about 20 to 40 parts by weight based on 100 parts by weight of the cross-linking monomer.

2. The barrier rib of claim 1, wherein the photopolymerization initiator is included in an amount of about 10 to 50 parts by weight based on 100 parts by weight of the cross-linking monomer.

3. The barrier rib of claim 1, wherein the photopolymerization initiator is at least one selected from the group consisting of triazine-based, benzoin-based, acetophenone-based, imidazole-based, amino ketone-based, and xanthone-based compounds.

4. The barrier rib of claim 3, wherein the photopolymerization initiator is at least one selected from the group consisting of 2,4-bistrichloromethyl-6-p-methoxystyryl-s-triazine, 2-p-methoxystyryl-4,6-bistrichloromethyl-s-triazine, 2,4-trichloromethyl-6-triazine, 2,4-trichloromethyl-4-methylnaphthyl-6-triazine, benzophenone, p-(diethylamino)benzophenone, 2,2-dichloro-4-phenoxyacetophenone, 2,2'-diethoxyacetophenone, 2,2'-dibutoxyacetophenone, 2-hydroxy-2-methylpropinophenone, p-t-butyltrichloroacetophenone, 2-methylthioxanthone, 2-isobutylthioxanthone, 2-dodecylthioxanthone, 2,4-dimethylthioxanthone, 2,4-diethylthioxanthone, 2-benzyl-2-(dimethyl amino)-1-[-4-(4-morpholinyl)phenyl]-1-butanone, 2-methyl-1-[4-(methylthio)phenyl]-2- (4-morpholinyl)-1-propanone, and 2,2'-bis-2-chlorophenyl-4,5,4',5'-tetraphenyl-2'-1,2'-biimidazole.

5. The barrier rib of claim 1, wherein the cross-linking monomer is at least one selected from the group consisting of 1,4-butanedioldiacrylate, 1,3-butyleneglycoldiacrylate, ethyleneglycoldiacrylate, pentaerythrytoltetraacrylate, triethyleneglycoldiacrylate, polyethyleneglycoldiacrylate, dipentaerythrytoldiacrylate, sorbitoltriacrylate, bisphenol A diacrylate derivative, trimethylpropanetriacrylate, ethyleneoxide addition trimethylpropanetriacrylate, dipentaerythrytolpolyacrylate, 1,4-butanedioldimethacrylate, 1,3-butyleneglycoldimethacrylate, ethyleneglycoldimethacrylate, pentaerythrytoltetramethacrylate, triethyleneglycoldimethacrylate, polyethyleneglycoldimethacrylate, dipentaerythrytoldimethacrylate, sorbitoltrimethacrylate, bisphenol A dimethacrylate derivative, and trimethylpropanetrimethacrylate, dipentaerythrytolpolymethacrylate.

6. The barrier rib of claim 1, wherein the organic solvent is at least one selected from the group consisting of ethyleneglycolmonomethyletheracetate, propyleneglycolmonomethylether, propyleneglycolmethyletheracetate, propyleneglycolmonoethyletheracetate, diethyleneglycoldimethylether, diethyleneglycolmethylethylether, cyclohexanone, 3-methoxyethyl propionate, 3-ethoxymethyl propionate, 3-ethoxyethyl propionate, methyl ethyl ketone, isopropyl alcohol, ethanol, methanol, butyl cellosolve (BC), butyl carbitol acetate (BCA), terpineol (TP), and texanol.

7. The barrier rib of claim 1, wherein the composition for the barrier rib further comprises a binder.

8. The barrier rib of claim 1, wherein the photosensitive composition is included in an amount of about 5 to 15 parts by weight based on 100 parts by weight of the mother-glass powder.

9. The barrier rib of claim 8, wherein the photosensitive composition is included in an amount of about 7 to 10 parts by weight based on 100 parts by weight of the mother-glass powder.

10. The barrier rib of claim 1, wherein the composition for forming the barrier rib is non-conductive.

* * * * *